(12) United States Patent
Kikushima et al.

(10) Patent No.: US 9,264,015 B2
(45) Date of Patent: Feb. 16, 2016

(54) PACKAGE, RESONATION DEVICE, OSCILLATOR, ELECTRONIC DEVICE, AND MOVING OBJECT

(71) Applicant: Seiko Epson Corporation, Tokyo (JP)

(72) Inventors: Masayuki Kikushima, Ina (JP); Toshiaki Sato, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/527,190

(22) Filed: Oct. 29, 2014

(65) Prior Publication Data
US 2015/0116052 A1     Apr. 30, 2015

(30) Foreign Application Priority Data
Oct. 30, 2013   (JP) .................................. 2013-225049

(51) Int. Cl.
| | |
|---|---|
| *H03B 5/32* | (2006.01) |
| *H01L 41/047* | (2006.01) |
| *H01L 41/053* | (2006.01) |
| *H03H 9/10* | (2006.01) |
| *H03H 9/17* | (2006.01) |
| *H03H 9/05* | (2006.01) |
| *H03H 9/08* | (2006.01) |

(52) U.S. Cl.
CPC ......... *H03H 9/0552* (2013.01); *H01L 41/0472* (2013.01); *H01L 41/0475* (2013.01); *H01L 41/053* (2013.01); *H03B 5/32* (2013.01); *H03H 9/08* (2013.01); *H03H 9/10* (2013.01); *H03H 9/1021* (2013.01); *H03H 9/172* (2013.01)

(58) Field of Classification Search
CPC ............. H01L 41/047; H01L 41/0472; H01L 41/0475; H01L 41/053; H03H 9/0547; H03H 9/10; H03H 9/17; H03H 9/172; H03H 9/19; H03B 5/30; H03B 5/32
USPC .......... 310/344, 348, 365, 366, 368; 331/154, 331/156, 158
See application file for complete search history.

(56) References Cited

U.S. PATENT DOCUMENTS

| | | | |
|---|---|---|---|
| 2006/0170305 A1* | 8/2006 | Ohshima et al. | ............... 310/311 |
| 2011/0234047 A1 | 9/2011 | Muraki et al. | |

(Continued)

FOREIGN PATENT DOCUMENTS

| | | |
|---|---|---|
| JP | 2012-080249 A | 4/2012 |
| JP | 2012-080250 A | 4/2012 |

(Continued)

*Primary Examiner* — Levi Gannon
(74) *Attorney, Agent, or Firm* — Harness, Dickey & Pierce, P.L.C.

(57) ABSTRACT

A quartz crystal resonator includes a quartz crystal resonator element, a thermistor, a second layer including a first principal surface and a second principal surface, and a third layer having a through hole. internal terminals are provided on the first principal surface side, and electrode pads are provided in a portion exposed from the through hole on the second principal surface side. The quartz crystal resonator element is attached to the internal terminals, and the thermistor is attached to the electrode pads. Two mounting terminals are provided on a first diagonal line on the third principal surface side of the third layer, and two mounting terminals are provided on a second diagonal line. At least one of the two electrode pads is connected to any one of the two mounting terminals on the second diagonal line through a first conductive film provided on an inner wall of the through hole.

20 Claims, 7 Drawing Sheets

(56) References Cited

U.S. PATENT DOCUMENTS

| | | | |
|---|---|---|---|
| 2012/0229223 A1* | 9/2012 | Il et al. | 331/155 |
| 2012/0229225 A1* | 9/2012 | Horie | 331/158 |
| 2012/0319792 A1* | 12/2012 | Harima | 331/158 |
| 2013/0257549 A1* | 10/2013 | Asamura | 331/68 |

FOREIGN PATENT DOCUMENTS

| | | |
|---|---|---|
| JP | 2012-099935 A | 5/2012 |
| JP | 2012-099944 A | 5/2012 |
| JP | 2012-119911 A | 6/2012 |
| JP | 2012-142683 A | 7/2012 |
| JP | 2012-142691 A | 7/2012 |
| JP | 2012-160870 A | 8/2012 |
| JP | 2012-160875 A | 8/2012 |
| JP | 2012-182565 A | 9/2012 |
| JP | 2013-051612 A | 3/2013 |
| JP | 2013-102315 A | 5/2013 |

* cited by examiner

PACKAGE, RESONATION DEVICE, OSCILLATOR, ELECTRONIC DEVICE, AND MOVING OBJECT

BACKGROUND

1. Technical Field

The present invention relates to a package, a resonation device, an oscillator including the resonation device, an electronic device, and a moving object.

2. Related Art

Hitherto, as a resonation device, a piezoelectric device has been known which includes a piezoelectric resonation element, a temperature-sensitive component, and a container that has a first accommodation portion accommodating a piezoelectric resonation element and a second accommodation portion accommodating a temperature-sensitive component (for example, see JP-A-2013-102315).

The container of the piezoelectric device includes a first insulating substrate and a second insulating substrate. The first insulating substrate has a through hole constituting the second accommodation portion and includes a plurality of mounting terminals formed in the bottom thereof. The second insulating substrate has a back face being laminated on and fixed to a surface portion of the first insulating substrate. A front face of the second insulating substrate is provided with a first electrode pad for mounting a piezoelectric resonation element. The back face of the second insulating substrate is provided with a first wiring pattern that allows electrical conduction between amounting terminal and the first electrode pad, a second wiring pattern that allows electrical conduction between the mounting terminal and a temperature-sensitive component, and a second electrode pad for mounting the temperature-sensitive component.

In accordance with the demands of the market, the piezoelectric device may be configured such that the pair of mounting terminals electrically communicating with the piezoelectric resonation element and another pair of mounting terminals electrically communicating with the temperature-sensitive component are disposed respectively on diagonal lines of the bottom of the first insulating substrate.

Thus, in the piezoelectric device configured in the above-described manner, the routing of the first wiring pattern and the second wiring pattern in the back face of the second insulating substrate (see FIG. 3B in JP-A-2013-102315) becomes complicated, as compared with the routing in a configuration in which the pair of mounting terminals are disposed respectively at adjacent corner portions of the bottom rather than being disposed on the diagonal lines of the bottom (see FIG. 9B in JP-A-2013-102315).

As a result, in the piezoelectric device configured in the above-described manner, there is a concern that a further reduction in a planar size may be hindered due to restrictions (a wiring rule such as a pattern width, a gap between patterns, a distance between a contour and a pattern) of the routing of the first wiring pattern and the second wiring pattern.

Consequently, as a countermeasure to the above-described problem, a configuration is considered in which the first wiring pattern is routed on the front face of the second insulating substrate and the second wiring pattern is routed on the back face of the second insulating substrate, as shown in FIG. 4 of JP-A-2013-102315.

However, in this configuration, since the first wiring pattern and the piezoelectric resonation element are close to each other, a parasitic capacitance is generated between an excitation electrode of the piezoelectric resonation element and the first wiring pattern, and thus there is a concern that resonation characteristics of the piezoelectric resonation element may be degraded.

SUMMARY

An advantage of some aspects of the invention is to solve at least a part of the problems described above, and the invention can be implemented as the following forms or application examples.

Application Example 1

This application example is directed to a package including a first substrate that includes a first principal surface and a second principal surface which serve as front and back sides, respectively, and a second substrate that is laminated on the second principal surface side of the first substrate and has a through hole. A first electrode pad and a second electrode pad are provided on the first principal surface side of the first substrate. A third electrode pad and a fourth electrode pad are provided in a portion exposed from the through hole on the second principal surface side of the first substrate. A first mounting terminal and a second mounting terminal are provided on a first diagonal line on a third principal surface side of the second substrate which is opposite to the first substrate side, and a third mounting terminal and a fourth mounting terminal are provided on a second diagonal line intersecting the first diagonal line. The first electrode pad is connected to the first mounting terminal through a first wiring pattern provided on the second principal surface side of the first substrate. The second electrode pad is connected to the second mounting terminal through a second wiring pattern provided on the second principal surface side of the first substrate. At least one of the third electrode pad and the fourth electrode pad is connected to any one of the third mounting terminal and the fourth mounting terminal through a first conductive film provided on an inner wall of the through hole.

In this configuration, in the package (container), at least one of the third electrode pad and the fourth electrode pad is connected to any one of the third mounting terminal and the fourth mounting terminal through the first conductive film provided on the inner wall of the through hole.

As a result, in the package, it is possible to cause the first wiring pattern and the second wiring pattern connecting the first electrode pad and the second electrode pad to the first mounting terminal and the second mounting terminal, respectively, to three-dimensionally intersect a wiring pattern connecting the third electrode pad and the fourth electrode pad to any one of the third mounting terminal and the fourth mounting terminal, and to superimpose both the wiring pattern and the first and second wiring patterns on each other when seen in a plan view.

Thus, in the package, the occupancy areas of the wiring patterns when seen in a plan view can be reduced as compared with those in the configuration of the related art (for example, the above-described configuration of JP-A-2013-102315), and thus it is possible to achieve a further reduction in a plane size.

Application Example 2

This application example is directed to a resonation device including a resonator element; an electronic element; a first substrate that includes a first principal surface and a second principal surface which serve as front and back sides, respectively; and a second substrate that is laminated on the second principal surface side of the first substrate and has a through hole. A first electrode pad and a second electrode pad are provided on the first principal surface side of the first substrate. A third electrode pad and a fourth electrode pad are provided in a portion exposed from the through hole on the second principal surface side of the first substrate. The resonator element is attached to the first electrode pad and the second electrode pad. The electronic element is attached to the third electrode pad and the fourth electrode pad. A first mounting terminal and a second mounting terminal are provided on a first diagonal line on a third principal surface side of the second substrate which is opposite to the first substrate side, and a third mounting terminal and a fourth mounting terminal are provided on a second diagonal line intersecting the first diagonal line. The first electrode pad is connected to the first mounting terminal through a first wiring pattern provided on the second principal surface side of the first substrate. The second electrode pad is connected to the second mounting terminal through a second wiring pattern provided on the second principal surface side of the first substrate. At least one of the third electrode pad and the fourth electrode pad is connected to any one of the third mounting terminal and the fourth mounting terminal through a first conductive film provided on an inner wall of the through hole.

In this configuration, in the resonation device, at least one of the third electrode pad and the fourth electrode pad is connected to any one of the third mounting terminal and the fourth mounting terminal through the first conductive film provided on the inner wall of the through hole.

As a result, in the resonation device, it is possible to cause the first wiring pattern and the second wiring pattern connecting the resonator element to the first mounting terminal and the second mounting terminal to three-dimensionally intersect a wiring pattern connecting the electronic element to any one of the third mounting terminal and the fourth mounting terminal, and to superimpose both the wiring pattern and the first and second wiring patterns on each other when seen in a plan view.

Thus, in the resonation device, the occupancy areas of the wiring patterns when seen in a plan view can be reduced as compared with those in the configuration of the related art (for example, the above-described configuration of JP-A-2013-102315), and thus it is possible to achieve a further reduction in a plane size.

Further, in the resonation device, the first wiring pattern and the second wiring pattern are provided on the second principal surface side of the first substrate, and thus it is possible to avoid an increase in a parasitic capacitance due to the resonator element on the first principal surface side and to maintain resonation characteristics of the resonator element.

Application Example 3

In the resonation device according to the application example described above, it is preferable that a second conductive film is provided on the third principal surface side of the second substrate along an outer edge of the through hole.

In this configuration, in the resonation device, the second conductive film is provided along the outer edge of the through hole when seen in a plan view. Thereby, the through hole can be recognized by an image recognition apparatus using a difference in the contrast of reflected light between the second conductive film and the vicinity, for example, when irradiation with light is performed, and thus it is possible to improve the mounting position accuracy of the electronic element with respect to the through hole.

Application Example 4

In the resonation device according to the application example described above, it is preferable that the second conductive film is connected to the first conductive film.

In this configuration, in the resonation device, the second conductive film is connected to the first conductive film, and thus thermal conduction to the electronic element is improved. At this time, for example, when the electronic element is a thermosensitive element, followability with respect to changes in the temperature of the resonator element is improved.

As a result, in the resonation device, it is possible to reduce a frequency fluctuation associated with the changes in the temperature of the resonator element by using an external temperature compensation circuit which operates on the basis of a detected temperature (change in a resistance value) of the thermosensitive element.

Application Example 5

In the resonation device according to the application example described above, it is preferable that a groove portion is provided between the third electrode pad and the fourth electrode pad.

In this configuration, in the resonation device, the groove portion is provided between the third electrode pad and the fourth electrode pad, and thus the outflow of a bonding member such as solder at the time of mounting the electronic element is blocked by the groove portion.

As a result, in the resonation device, it is possible to suppress a short circuit occurring between the third electrode pad and the fourth electrode pad through the bonding member.

Application Example 6

In the resonation device according to the application example described above, it is preferable that a stepped portion recessed to the second principal surface side is provided in the third principal surface of the second substrate, and the through hole is provided in the stepped portion.

In this configuration, in the resonation device, the stepped portion recessed to the second principal surface side is provided in the third principal surface of the second substrate, and the through hole is provided in the stepped portion. Thus, it is possible to enlarge an interval in a thickness direction between the mounting terminals and the first and second conductive films.

As a result, in the resonation device, it is possible to suppress a short circuit occurring between the mounting terminals, which are not connected to each other, and the first and second conductive films due to the bonding member such as solder when the resonation device is mounted on an external member such as an electronic device.

Application Example 7

In the resonation device according to the application example described above, it is preferable that each of the areas of the third electrode pad and the fourth electrode pad accounts for equal to or higher than 15% and equal to or less than 30%, when seen in a plan view, with respect to an area of an opening of the through hole.

In this configuration, in the resonation device, each of the areas of the third electrode pad and the fourth electrode pad accounts for equal to or higher than 15% and equal to or less than 30%, when seen in a plan view, with respect to the area of the opening of the through hole, and thus it is possible to improve the image recognition of the third electrode pad and the fourth electrode pad.

In the resonation device, the ratio of the areas of the third electrode pad and the fourth electrode pad to the area of the bonding member such as solder, which is applied to the third electrode pad and the fourth electrode pad, can be increased to such an extent that the image recognition of both the bonding member and the pads can be performed through the above-described setting.

As a result, in the resonation device, it is possible to manage an application diameter (the amount of application) of the bonding member such as solder with a high level of accuracy by using an image recognition apparatus.

In the resonation device, it is possible to improve the mounting position accuracy of the electronic element with respect to the third electrode pad and the fourth electrode pad by improving the image recognition of the third electrode pad and the fourth electrode pad.

Meanwhile, the numerical values are based on information obtained by an experiment, simulation, and the like of the inventors.

Application Example 8

In the resonation device according to the application example described above, it is preferable that each of areas of the third electrode pad and the fourth electrode pad accounts for equal to or higher than 19.5% and equal to or less than 23.5%, when seen in a plan view, with respect to the area of the opening of the through hole.

In this configuration, in the resonation device, each of the areas of the third electrode pad and the fourth electrode pad accounts for equal to or higher than 19.5% and equal to or less than 23.5%, when seen in a plan view, with respect to the area of the opening of the through hole, and thus it is possible to suppress a short circuit occurring between the third electrode pad and the fourth electrode pad due to the bonding member such as solder while further improving the image recognition of the third electrode pad and the fourth electrode pad.

Meanwhile, the numerical values are based on information obtained by an experiment, simulation, and the like of the inventors.

Application Example 9

In the resonation device according to the application example described above, it is preferable that each of areas of the third electrode pad and the fourth electrode pad accounts for equal to or higher than 70% and equal to or less than 150%, when seen in a plan view, with respect to an area of the electronic element.

In this configuration, in the resonation device, each of the areas of the third electrode pad and the fourth electrode pad accounts for equal to or higher than 70% and equal to or less than 150%, when seen in a plan view, with respect to the area of the electronic element, and thus it is possible to reliably perform the image recognition of both the electronic element and the third and fourth electrode pads.

As a result, in the resonation device, it is possible to improve the mounting position accuracy of the electronic element with respect to the third electrode pad and the fourth electrode pad.

Meanwhile, the numerical values are based on information obtained by an experiment, simulation, and the like of the inventors.

Application Example 10

In the resonation device according to the application example described above, it is preferable that each of areas of the third electrode pad and the fourth electrode pad accounts for equal to or higher than 75% and equal to or less than 145%, when seen in a plan view, with respect to an area of the electronic element.

In this configuration, in the resonation device, each of the areas of the third electrode pad and the fourth electrode pad accounts for equal to or higher than 75% and equal to or less than 145%, when seen in a plan view, with respect to the area of the electronic element, and thus it is possible to further reliably perform the image recognition of both the electronic element and the third and fourth electrode pads.

As a result, in the resonation device, it is possible to further improve the mounting position accuracy of the electronic element with respect to the third electrode pad and the fourth electrode pad.

Meanwhile, the numerical values are based on information obtained by an experiment, simulation, and the like of the inventors.

Application Example 11

In the resonation device according to the application example described above, it is preferable that an outline of the through hole includes a curved line when seen in a plan view.

In this configuration, in the resonation device, the outline of the through hole includes a curved line when seen in a plan view, and thus it is possible to enlarge the through hole while avoiding interference with the mounting terminals, for example, by rounding corner portions of the through hole.

Thereby, in the resonation device, it is possible to improve the image recognition of the third electrode pad and the fourth electrode pad.

Application Example 12

In the resonation device according to the application example described above, it is preferable that an outline of each of the mounting terminals on the through hole side includes a curved line when seen in a plan view.

In this configuration, in the resonation device, the outlines of the mounting terminals on the through hole side include a curved line when seen in a plan view, and thus it is possible to secure a fixed interval between the mounting terminals, which are not connected to each other, and the third and fourth electrode pads.

Thereby, in the resonation device, it is possible to suppress a short circuit occurring between the mounting terminals, which are not connected to each other, and the third and fourth electrode pads.

Application Example 13

In the resonation device according to the application example described above, it is preferable that the electronic element is a thermosensitive element.

In this configuration, in the resonation device, the electronic element is a thermosensitive element, and thus it is possible to detect the temperature of the resonator element by using the thermosensitive element.

As a result, in the resonation device, it is possible to reduce a frequency fluctuation associated with the changes in the temperature of the resonator element, for example, by using an external temperature compensation circuit which operates on the basis of a detected temperature (change in a resistance value) of the thermosensitive element.

Application Example 14

This application example is directed to an oscillator including the resonation device according to any one of the application examples described above and a circuit.

In this configuration, the oscillator of this configuration includes the resonation device according to any one of the application examples and a circuit (for example, a driving circuit driving a resonator element), and thus it is possible to provide the oscillator exhibiting the effects according to any one of the application examples.

Application Example 15

This application example is directed to an electronic device including the resonation device according to any one of the application examples described above.

In this configuration, the electronic device of this configuration includes the resonation device according to any one of the application examples, and thus it is possible to provide the electronic device exhibiting the effects according to any one of the application examples.

Application Example 16

This application example is directed to a moving object including the resonation device according to any one of the application examples described above.

In this configuration, the moving object of this configuration includes the resonation device according to any one of the application examples, and thus it is possible to provide the moving object exhibiting the effects according to any one of the application examples.

BRIEF DESCRIPTION OF THE DRAWINGS

The invention will be described with reference to the accompanying drawings, wherein like numbers reference like elements.

FIG. 1A is a plan view when viewed from a lid side, FIG. 1B is a cross-sectional view taken along line A-A of FIG. 1A, and FIG. 1C is a plan view when viewed from a bottom side.

FIG. 4A is a plan view when viewed from a lid side, FIG. 4B is a cross-sectional view taken along line A-A of FIG. 4A, and FIG. 4C is a plan view when viewed from a bottom side.

FIG. 5A is a plan view when viewed from a lid side, FIG. 5B is a cross-sectional view taken along line A-A of FIG. 5A, and FIG. 5C is a plan view when viewed from a bottom side.

FIG. 6A is a plan view when viewed from a lid side, FIG. 6B is a cross-sectional view taken along line A-A of FIG. 6A, and FIG. 6C is a plan view when viewed from a bottom side.

DESCRIPTION OF EXEMPLARY EMBODIMENTS

Hereinafter, embodiments of the invention will be described with reference to the accompanying drawings.

First Embodiment

First, a quartz crystal resonator as an example of a resonation device will be described.

Figure 1A:
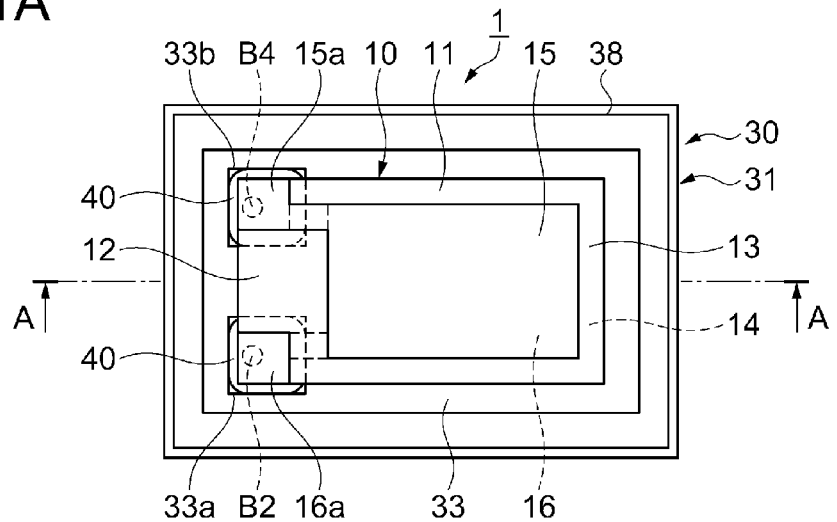
FIGS. 1A to 1C are diagrams showing a schematic configuration of a quartz crystal resonator according to a first embodiment.
Figure 1B:
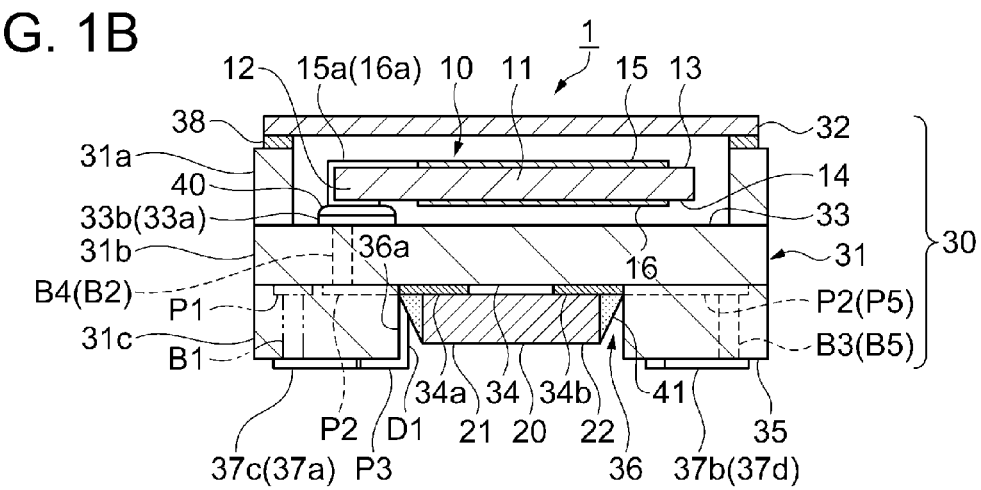
Figure 1C:
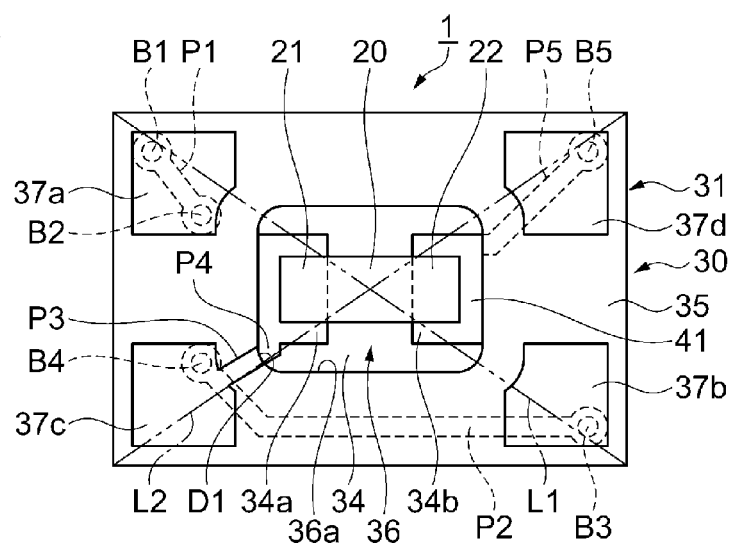

FIGS. 1A to 1C are diagrams showing a schematic configuration of a quartz crystal resonator according to a first embodiment. FIG. 1A is a plan view when viewed from a lid side, FIG. 1B is a cross-sectional view taken along line A-A of FIG. 1A, and FIG. 1C is a plan view when viewed from a bottom side. Meanwhile, in FIG. 1A, the lid is not shown. In addition, for better understanding, a dimensional ratio of each component is different from that of the actual one.

As shown in FIGS. 1A to 1C, a quartz crystal resonator 1 includes a quartz crystal resonator element 10 as a resonator element, a thermistor 20 that functions as a thermosensitive element as an electronic element, and a package 30 that accommodates the quartz crystal resonator element 10 and the thermistor 20.

The quartz crystal resonator element 10, which is an AT cut type which is cut out at a predetermined angle from, for example, a gemstone of quartz crystal, includes a resonation portion 11, which is formed to have substantially a rectangular planar shape and performs thickness shear resonation, and a base portion 12 which is connected to the resonation portion 11.

In the quartz crystal resonator element 10, the base portion 12 is provided with extraction electrodes 15a and 16a extracted from substantially rectangular excitation electrodes 15 and 16 which are formed respectively on one principal surface 13 and the other principal surface 14 of the resonation portion 11.

The extraction electrode 15a is extracted to the base portion 12 along a longitudinal direction (horizontal direction of the paper) of the quartz crystal resonator element 10 from the excitation electrode 15 of one principal surface 13, is wrapped around the other principal surface 14 along a side surface of the base portion 12, and extends up to the vicinity of the excitation electrode 16 of the other principal surface 14.

The extraction electrode 16a is extracted to the base portion 12 along the longitudinal direction of the quartz crystal resonator element 10 from the excitation electrode 16 of the other principal surface 14, is wrapped around one principal surface 13 along the side surface of the base portion 12, and extends up to the vicinity of the excitation electrode 15 of one principal surface 13.

The excitation electrodes 15 and 16 and the extraction electrodes 15a and 16a are formed as metal coatings configured such that, for example, Cr is used as a ground layer and Au is laminated thereon.

The thermistor 20, which is, for example, a chip type (rectangular parallelepiped shape) thermosensitive element (temperature sensing resistor element), is a resistor including electrodes 21 and 22 at both ends thereof and having electric resistance largely changing with changes in temperature.

For example, a thermistor called a negative temperature coefficient (NTC) thermistor having resistance decreasing with an increase in temperature is used as the thermistor 20. The NTC thermistor is frequently used as a temperature sensor due to proportional changes between a temperature and resistance value.

The thermistor 20, which is mounted on the package 30, functions as a temperature sensor to assist to suppress a frequency fluctuation associated with changes in the temperature of the quartz crystal resonator element 10 by detecting temperature in the vicinity of the quartz crystal resonator element 10.

The package 30 includes a package base 31 having substantially a flat plate shape of which the planar shape is substantially a rectangular shape, and a lid 32 as a planar lid, having a flat plate shape, which covers one side of the package base 31. The package is configured to have substantially a rectangular parallelepiped shape.

A ceramic based insulating material, such as an aluminum oxide sintered compact, a mullite sintered compact, an aluminum nitride sintered compact, a silicon carbide sintered compact, or a glass ceramic sintered compact, which is formed by molding, laminating, and baking a ceramic green sheet, quartz crystal, glass, silicon (high-resistance silicon), and the like are used as the package base 31.

The same material as that of the package base 31 or a metal such as Kovar or 42 alloy is used as the lid 32.

The package base 31 is configured as a three-layered structure. Specifically, a first layer 31a having a frame shape, a second layer 31b as a first substrate having a flat plate shape, and a third layer 31c as a second substrate having a through hole 36, having substantially a rectangular shape, in the central portion thereof are sequentially laminated from the lid 32 side.

The second layer 31b includes a first principal surface 33 and a second principal surface 34 which serve as front and back sides, respectively.

The package base 31 is configured such that the first layer 31a is laminated on the first principal surface 33 side of the second layer 31b and the third layer 31c is laminated on the second principal surface 34 side of the second layer 31b.

An internal terminal 33a as a first electrode pad and an internal terminal 33b as a second electrode pad are provided respectively at locations facing the extraction electrodes 15a and 16a of the quartz crystal resonator element 10 on the first principal surface 33 side of the second layer 31b.

An electrode pad 34a as a third electrode pad and an electrode pad 34b as a fourth electrode pad are provided at locations facing the electrodes 21 and 22 of the thermistor 20 in a portion on the second principal surface 34 side of the second layer 31b which is exposed from the through hole 36.

In the quartz crystal resonator element 10, the extraction electrodes 15a and 16a are attached to the internal terminal 33a and the internal terminal 33b, respectively, through a conductive adhesive 40 such as an epoxy-based, silicone-based, or polyimide-based adhesive mixed with a conductive material such as a metal filler.

In the thermistor 20, the electrodes 21 and 22 are attached to the electrode pad 34a and the electrode pad 34b, respectively, through a bonding member 41 such as solder.

In the quartz crystal resonator 1, the first layer 31a of the package base 31 is covered with the lid 32 in a state where the quartz crystal resonator element 10 is attached to the internal terminals 33a and 33b of the package base 31, and the package base 31 and the lid 32 are bonded to each other using a bonding member 38 such as a seam ring, a low-melting glass, or an adhesive, and thus the internal space (space accommodating the quartz crystal resonator element 10) of the package base 31 is airtightly sealed.

Meanwhile, the internal space of the package base 31 which is airtightly sealed is in a decompressed vacuum state (high vacuum state) or in a state where an inert gas such as nitrogen, helium, or argon is filled.

A mounting terminal 37a as a first mounting terminal and a mounting terminal 37b as a second mounting terminal are provided on a first diagonal line L1 of the third principal surface 35 on the third principal surface 35 side of the third layer 31c of the package base 31 which is opposite to the second layer 31b side. A mounting terminal 37c as a third mounting terminal and a mounting terminal 37d as a fourth mounting terminal are provided on a second diagonal line L2 intersecting the first diagonal line L1.

The internal terminal 33a is connected to the mounting terminal 37a through a wiring pattern P1 as a first wiring pattern which is provided on the second principal surface 34 side of the second layer 31b.

The internal terminal 33b is connected to the mounting terminal 37b through a wiring pattern P2 as a second wiring pattern which is provided on the second principal surface 34 side of the second layer 31b.

At least one (herein, the electrode pad 34a) of the electrode pad 34a and the electrode pad 34b is connected to any one (herein, the mounting terminal 37c) of the mounting terminal 37c and the mounting terminal 37d through a first conductive film D1 provided on an inner wall 36a of the through hole 36.

Specifically, the mounting terminal 37a is connected to the internal terminal 33a via an electrically conductive via (electrically conductive electrode in which a through hole is filled with a metal or a conductive material) B1 passing through the third layer 31c of the package base 31, a wiring pattern P1 provided on the second principal surface 34 side of the second layer 31b, and an electrically conductive via B2 passing through the second layer 31b.

The mounting terminal 37b is connected to the internal terminal 33b via an electrically conductive via B3 passing through the third layer 31c, a wiring pattern P2 provided on the second principal surface 34 side of the second layer 31b, and an electrically conductive via B4 passing through the second layer 31b.

The mounting terminal 37c is connected to the electrode pad 34a via a wiring pattern P3 provided on the third principal surface 35 side, a first conductive film D1 provided on the inner wall 36a of the through hole 36, and a wiring pattern P4 provided on the second principal surface 34 side of the second layer 31b.

The mounting terminal 37d is connected to the electrode pad 34b via an electrically conductive via B5 passing through the third layer 31c and a wiring pattern P5 provided on the second principal surface 34 side of the second layer 31b.

Here, as shown in FIG. 1C, the wiring pattern P3 extending from the mounting terminal 37c and the wiring pattern P2 connecting the mounting terminal 37b and the internal terminal 33b are provided on different surfaces, and thus it is possible to superimpose the patterns on each other when seen in a plan view by causing the patterns to three-dimensionally intersect each other.

On the other hand, when a configuration of the related art (for example, the above-described configuration of JP-A-2013-102315) is applied to this embodiment, the wiring pattern P3 is provided on the same surface (the second principal surface 34 of the second layer 31b) as that of the wiring pattern P2. Thus, the wiring pattern P3 is routed by detouring the wiring pattern P2 and the electrically conductive via B4 to the left side of the paper, and is connected to the mounting terminal 37c via an electrically conductive via, not shown in the drawing, which passes through the third layer 31c, and thus the routing of the wiring patterns P3 and P2 becomes complicated.

In contrast, the routing of the wiring patterns P3 and P2 according to this embodiment is simplified by the patterns superimposed on each other when seen in a plan view by causing the patterns to three-dimensionally intersect each other as described above, and thus it is possible to reduce occupancy areas of the wiring patterns P3 and P2 when seen in a plan view as compared with those in the configuration of the related art. In addition, an electrically conductive via, not shown in the drawing and necessary in the configuration of the related art, which passes through the third layer 31c used for the connection to the mounting terminal 37c becomes unnecessary.

The internal terminals 33a and 33b, the electrode pads 34a and 34b, the mounting terminals 37a to 37d, the wiring patterns P1 to P5, and the first conductive film D1 are constituted by a metal coating formed by laminating coatings such as Ni and Au on a metallized layer such as W or Mo using plating or the like.

Meanwhile, the first conductive film D1 can be formed, for example, by the following method.

First, a small through hole serving as a portion (preferably, a corner portion) of the through hole 36 is provided in the third layer 31c. Subsequently, a paste-like metallized layer is applied to the third principal surface 35 so as to cover the small through hole by screen printing or the like.

Subsequently, the metallized layer is sucked from the second layer 31b side, and is then hung (wrapped) on the inner wall of the small through hole.

Then, the small through hole is enlarged except for a portion in which the metallized layer is wrapped around, to thereby form the through hole 36.

It is possible to form the first conductive film D1 on the inner wall 36a of the through hole 36 by using such a method.

Here, in the quartz crystal resonator 1, a ratio of each of the areas of the electrode pads 34a and 34b to the area of the opening of the through hole 36 is preferably equal to or higher than 15% and equal to or less than 30%, when seen in a plan view, and is more preferably equal to or higher than 19.5% and equal to or less than 23.5%.

In the quartz crystal resonator 1, a ratio of each of the areas of the electrode pads 34a and 34b to the area of the thermistor 20 is preferably equal to or higher than 70% and equal to or less than 150%, when seen in a plan view, and is more preferably equal to or higher than 75% and equal to or less than 145%.

In the quartz crystal resonator 1, it is preferable that an outline of the through hole 36 includes a curved line when seen in a plan view. Specifically, as shown in FIG. 1C, in the outline of the through hole 36, it is preferable that four corner portions are rounded into an arc shape.

In the quartz crystal resonator 1, it is preferable that outlines of the mounting terminals 37a to 37d on the through hole 36 side include a curved line when seen in a plan view. Specifically, as shown in FIG. 1C, it is preferable that the outlines of the mounting terminals 37a to 37d on the through hole 36 side are gouged out (notched) into an arc shape along the outline of the through hole 36.

In the quartz crystal resonator 1, the quartz crystal resonator element 10 excites thickness shear resonation and resonates (oscillates) at a predetermined frequency in response to a driving signal applied from the outside via the mounting terminals 37a and 37b, the internal terminals 33a and 33b, the extraction electrodes 15a and 16a, and the excitation electrodes 15 and 16.

In the quartz crystal resonator 1, the thermistor 20 as a temperature sensor detects temperature inside the through hole 36 in the vicinity of the quartz crystal resonator element 10 in the package base 31 and outputs a detected signal through the mounting terminals 37c and 37d.

As described above, in the quartz crystal resonator 1 according to the first embodiment, at least one (herein, the electrode pad 34a) of the electrode pad 34a and the electrode pad 34b is connected to any one (herein, the mounting terminal 37c) of the mounting terminal 37c and the mounting terminal 37d through the first conductive film D1 provided on the inner wall 36a of the through hole 36.

As a result, in the quartz crystal resonator 1, the wiring pattern P2 connecting the quartz crystal resonator element 10 (internal terminal 33b) of the package base 31 and the mounting terminal 37b and the wiring pattern P3 connecting the thermistor 20 (electrode pad 34a) and the mounting terminal 37c three-dimensionally intersect each other, and thus it is possible to superimpose the patterns on each other when seen in a plan view.

Thereby, in the quartz crystal resonator 1, the occupancy areas of the wiring patterns P2 and P3 and the like when seen in a plan view can be reduced as compared with those in the configuration of the related art (for example, the above-described configuration of JP-A-2013-102315), and thus it is possible to achieve a further reduction in a plane size.

Meanwhile, also with regard to the single body of the package 30, it is possible to achieve a further reduction in a plane size through the above-described configuration.

In the quartz crystal resonator 1, the wiring pattern P1 and the wiring pattern P2 are provided on the second principal surface 34 side of the second layer 31b, and thus it is possible to avoid the generation of a parasitic capacitance due to the quartz crystal resonator element 10 provided on the first principal surface 33 side.

Thus, the quartz crystal resonator 1 can maintain satisfactory resonation characteristics of the quartz crystal resonator element 10.

In the quartz crystal resonator 1, the electronic element is the thermistor 20 as a thermosensitive element, and thus it is possible to detect the temperature of the quartz crystal resonator element 10 by using the thermistor 20.

As a result, in the quartz crystal resonator 1, it is possible to reduce a frequency fluctuation associated with changes in the temperature of the quartz crystal resonator element 10 by using an external temperature compensation circuit which operates on the basis of, for example, the detected temperature (change in a resistance value) of the thermistor 20.

Meanwhile, in the quartz crystal resonator 1, the electrode pad 34b and the wiring pattern P5 (mounting terminal 37d) may be connected to each other through another conductive film by causing the wiring pattern P5 to extend toward the through hole 36 from the mounting terminal 37d on the third principal surface 35 and by providing the conductive film on the inner wall 36a of the through hole 36.

Thus, in the quartz crystal resonator 1, both the electrode pads 34a and 34b are connected to the mounting terminals 37c and 37d through the first conductive film. D1 and another conductive film.

Accordingly, in the quartz crystal resonator 1, the electrically conductive via B5 becomes unnecessary, and thus the manufacture of the package base 31 is facilitated.

In the quartz crystal resonator 1, a ratio of each of the areas of the electrode pads 34a and 34b to the area of the opening of the through hole 36 is equal to or higher than 15% and equal to or less than 30% when seen in a plan view, and thus it is possible to improve the image recognition of the electrode pads 34a and 34b.

In the quartz crystal resonator 1, the ratio of the areas of the electrode pads 34a and 34b to the areas of the bonding member 41 such as solder, which is applied to the electrode pads 34a and 34b, can be increased to such an extent that the image recognition of both the bonding member and the pads can be performed through the above-described setting.

As a result, in the quartz crystal resonator 1, it is possible to manage an application diameter (the amount of application) of the bonding member 41 such as solder with a high level of accuracy by using an image recognition apparatus.

In the quartz crystal resonator 1, it is possible to improve the mounting position accuracy of the thermistor 20 with respect to the electrode pads 34a and 34b by improving the image recognition of the electrode pads 34a and 34b.

Meanwhile, the numerical values are based on information obtained by an experiment, simulation, and the like of the inventors.

In the quartz crystal resonator 1, a ratio of each of the areas of the electrode pads 34a and 34b to the area of the opening of the through hole 36 is equal to or higher than 19.5% and equal to or less than 23.5% when seen in a plan view, and thus it is possible to suppress a short circuit occurring between the electrode pad 34a and the electrode pad 34b due to the bonding member 41 such as solder while further improving the image recognition of the electrode pads 34a and 34b.

Meanwhile, the numerical values are based on information obtained by an experiment, simulation, and the like of the inventors.

In the quartz crystal resonator 1, a ratio of each of the areas of the electrode pads 34a and 34b to the area of the thermistor 20 is equal to or higher than 70% and equal to or less than 150% when seen in a plan view, and thus it is possible to reliably perform the image recognition of both the thermistor 20 and the electrode pads 34a and 34b.

As a result, in the quartz crystal resonator 1, it is possible to improve the mounting position accuracy of the thermistor 20 with respect to the electrode pads 34a and 34b.

Meanwhile, the numerical values are based on information obtained by an experiment, simulation, and the like of the inventors.

In the quartz crystal resonator 1, a ratio of each of the areas of the electrode pads 34a and 34b to the area of the thermistor 20 is equal to or higher than 75% and equal to or less than 145% when seen in a plan view, and thus it is possible to further reliably perform the image recognition of both the thermistor 20 and the electrode pads 34a and 34b.

As a result, in the quartz crystal resonator 1, it is possible to further improve the mounting position accuracy of the thermistor 20 with respect to the electrode pads 34a and 34b.

Meanwhile, the numerical values are based on information obtained by an experiment, simulation, and the like of the inventors.

In the quartz crystal resonator 1, the outline of the through hole 36 includes a curved line when seen in a plan view, and thus it is possible to enlarge the through hole 36 while avoiding interference with the mounting terminals 37a to 37d by rounding the corner portions of the through hole. Thereby, in the quartz crystal resonator 1, it is possible to improve the image recognition of the electrode pads 34a and 34b.

In the quartz crystal resonator 1, the outlines of the mounting terminals 37a to 37d on the through hole 36 side include a curved line when seen in a plan view, and thus it is possible to secure a fixed interval between the mounting terminals 37a to 37d, which are not connected to each other, and the electrode pads 34a and 34b. Thereby, in the quartz crystal resonator 1, it is possible to suppress a short circuit occurring between the electrode pad 34a and the electrode pad 34b and the mounting terminals 37a to 37d which are not connected to each other.

Meanwhile, in the quartz crystal resonator 1, the bonding member 38 formed thick may be used instead of the first layer 31a of the package base 31 as long as the securing of an internal space is not affected.

Accordingly, in the quartz crystal resonator 1, the package base 31 can be configured to have a two-layered structure, and thus the manufacture of the package base 31 is facilitated.

Next, a modification example of the first embodiment will be described.

Modification Example 1

Figure 2:
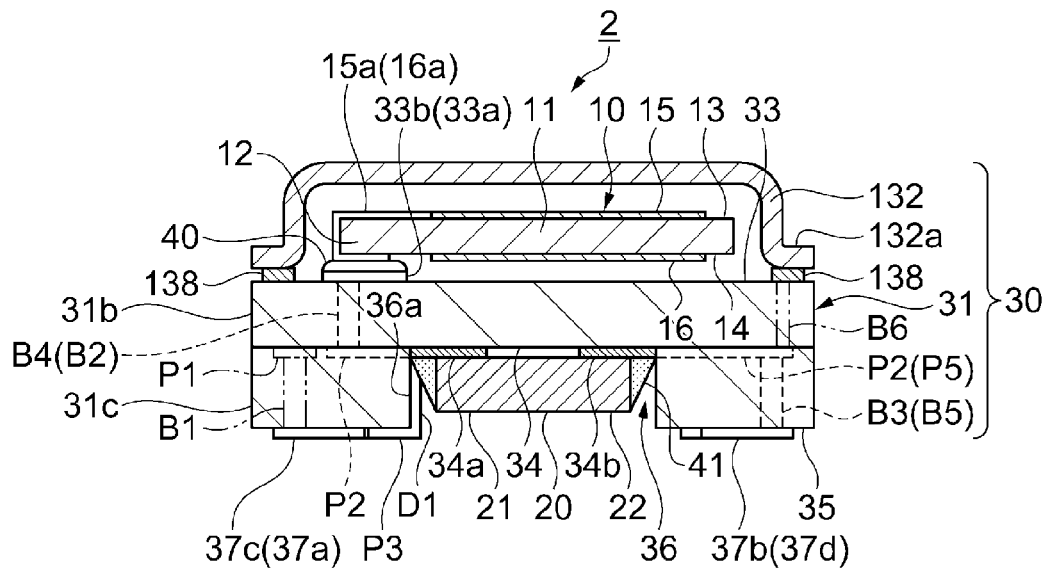
FIG. 2 is a cross-sectional view showing a schematic configuration of a quartz crystal resonator according to Modification Example 1.

FIG. 2 is a cross-sectional view showing a schematic configuration of a quartz crystal resonator according to Modification Example 1. Meanwhile, the location of the section is the same as that in FIGS. 1A to 1C.

Meanwhile, portions in common with those in the first embodiment are denoted by the same reference numerals and signs, and the detailed description thereof will be omitted. The description will be given focusing on the differences from the first embodiment.

As shown in FIG. 2, a quartz crystal resonator 2 according to Modification Example 1 is different from that according to the first embodiment in the configuration of the package 30.

In the quartz crystal resonator 2, the frame-shaped first layer 31a of the package base 31 is omitted as compared with the first embodiment.

In the quartz crystal resonator 2, the first principal surface 33 side of the second layer 31b of the package base 31 is airtightly sealed by a lid 132, made of a metal, which covers a quartz crystal resonator element 10. The lid 132 is formed of a metal such as Kovar or 42 alloy so as to have a cap shape in which a flange portion 132a is provided on the entire periphery thereof.

In the quartz crystal resonator 2, an internal space where the quartz crystal resonator element 10 can vibrate is secured by the swelling of the cap portion of the lid 132.

In the lid 132, the flange portion 132a is bonded to the first principal surface 33 side of the second layer 31b of the package base 31 through a conductivity bonding member 138 such as a seam ring, a brazing material, or a conductive adhesive.

Similarly to the first embodiment, in the quartz crystal resonator 2, the internal space is in a decompressed vacuum state (high vacuum state) or in a state where an inert gas such as nitrogen, helium, or argon is filled.

In the quartz crystal resonator 2, the mounting terminal 37d is electrically connected to the lid 132 via an electrically conductive via B6 and the conductivity bonding member 138 which are provided so as to pass through the electrically conductive via B5, the wiring pattern P5, and the second layer 31b.

The mounting terminal 37*d* is electrically connected to the electrode 22 of the thermistor 20 through the electrode pad 34*b* and serves as a ground terminal (GND terminal).

As described above, in the quartz crystal resonator 2, the first principal surface 33 side is airtightly sealed by the lid 132, made of a metal, which covers the quartz crystal resonator element 10, and the mounting terminal 37*d* is electrically connected to the lid 132, and thus it is possible to improve a shielding property.

In the quartz crystal resonator 2, the mounting terminal 37*d* electrically connected to the lid 132 is a ground terminal (GND terminal), and thus it is possible to further improve a shielding property.

In the quartz crystal resonator 2, the package base 31 is configured to have a two-layered structure, and thus the manufacture of the package base 31 is facilitated as compared with the three-layered structure in the first embodiment.

Meanwhile, in the quartz crystal resonator 2, the lid 132 and the mounting terminal 37*d* may not be electrically connected to each other as long as the shielding property is not affected. In this case, the conductivity bonding member 138 may be replaced with the bonding member 38.

In the quartz crystal resonator 2, the conductivity bonding member 138 is formed thick so as to secure an internal space of the package 30, and thus the lid 132 may be formed as the lid 32 having a flat plate shape which is the same as that in the first embodiment.

Meanwhile, the configuration of the quartz crystal resonator 2 can also be applied to the following modification example and embodiments.

Modification Example 2

Figure 3:
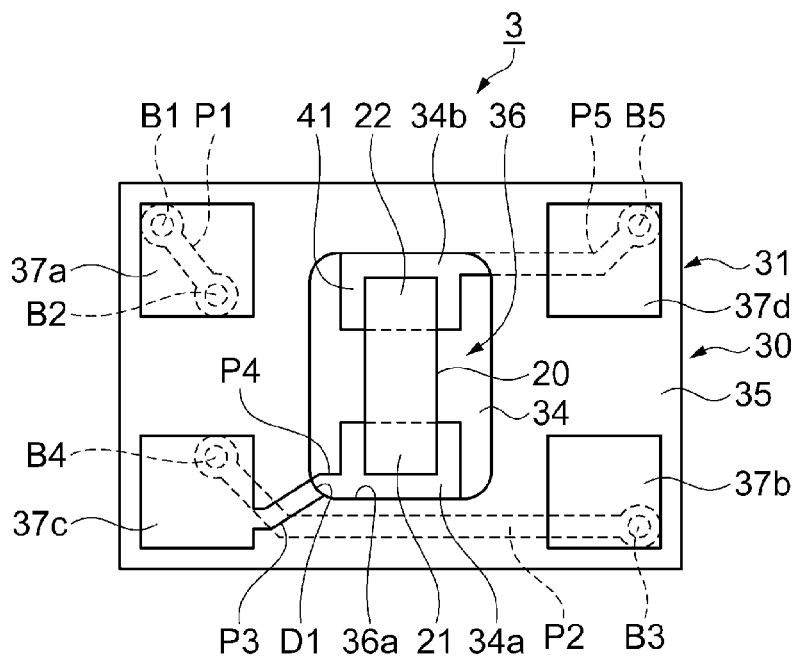
FIG. 3 is a plan view showing a schematic configuration of a quartz crystal resonator according to Modification Example 2 when viewed from a bottom side.

FIG. 3 is a plan view showing a schematic configuration of a quartz crystal resonator according to Modification Example 2 when viewed from a bottom side.

Meanwhile, portions in common with those in the first embodiment are denoted by the same reference numerals and signs, and the detailed description thereof will be omitted. The description will be given focusing on the differences from the first embodiment.

As shown in FIG. 3, a quartz crystal resonator 3 according to Modification Example 2 is different from that according to the first embodiment in an arrangement direction of the thermistor 20.

The thermistor 20 of the quartz crystal resonator 3 is disposed so that a direction (longitudinal direction) connecting the electrode 21 and the electrode 22 intersects (herein, is orthogonal to) a longitudinal direction (horizontal direction of the paper) of the package base 31.

Accordingly, the quartz crystal resonator 3 is disposed so that the longitudinal direction of the thermistor 20 intersects (is orthogonal to) the longitudinal direction of the package base 31, and thus it is possible to suppress a reduction in the fixing strength (mounting strength) of the thermistor 20 which is caused by the warpage of the package base 31 (the warpage in the longitudinal direction tends to be large).

Meanwhile, the configuration of the quartz crystal resonator 3 can also be applied to the above-described modification examples and the following embodiments.

Second Embodiment

Next, a quartz crystal resonator according to a second embodiment will be described.

Figure 4A:
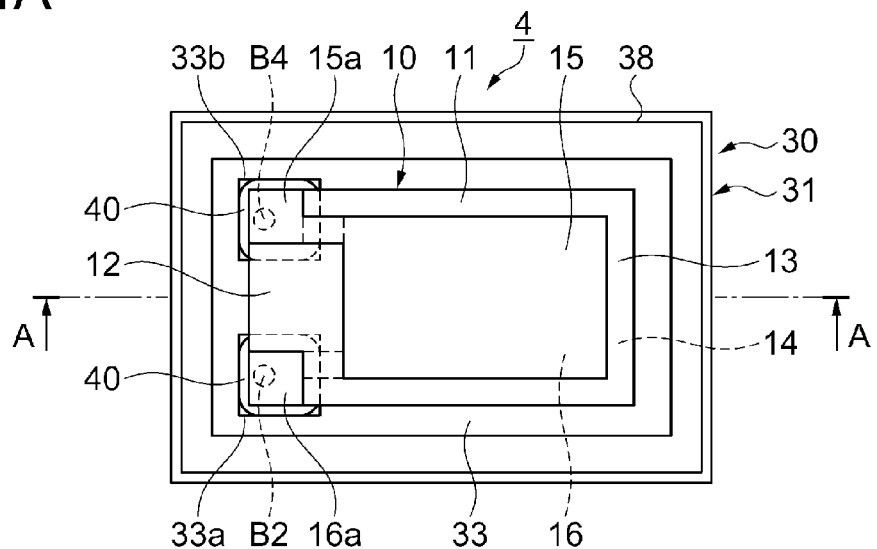
FIGS. 4A to 4C are diagrams showing a schematic configuration of a quartz crystal resonator according to a second embodiment.
Figure 4B:
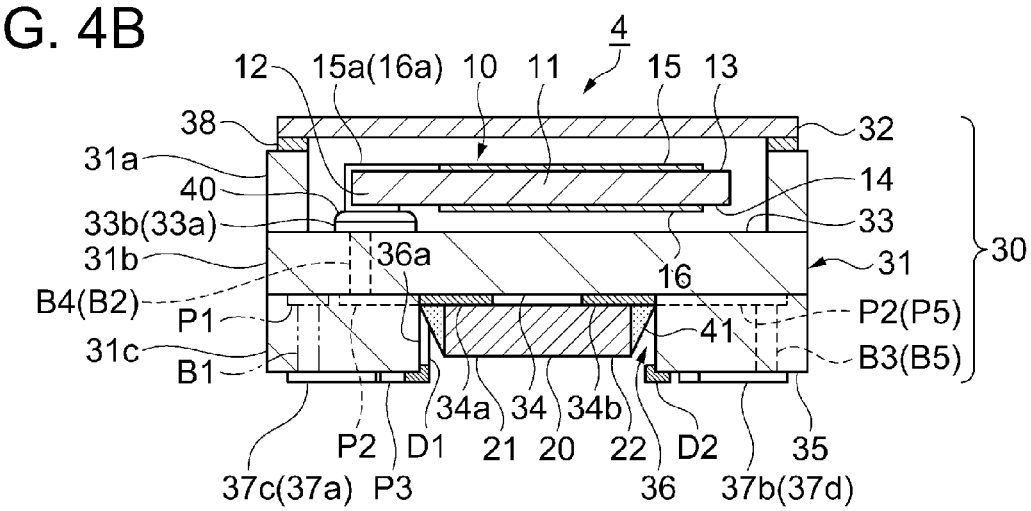
Figure 4C:
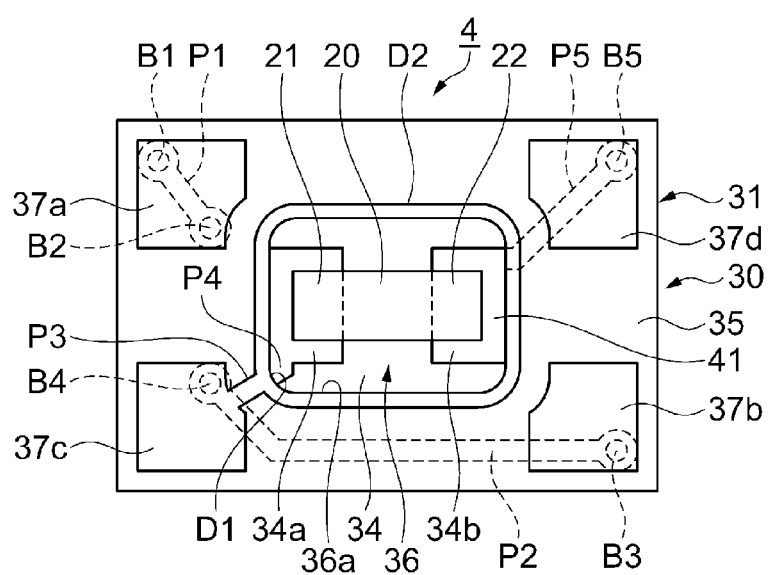

FIGS. 4A to 4C are diagrams showing a schematic configuration of the quartz crystal resonator according to the second embodiment. FIG. 4A is a plan view when viewed from a lid side, FIG. 4B is a cross-sectional view taken along line A-A of FIG. 4A, and FIG. 4C is a plan view when viewed from a bottom side. Meanwhile, in FIG. 4A, the lid is not shown.

Meanwhile, portions in common with those in the first embodiment are denoted by the same reference numerals and signs, and the detailed description thereof will be omitted. The description will be given focusing on the differences from the first embodiment.

As shown in FIGS. 4B and 4C, in a quartz crystal resonator 4 according to the second embodiment, a second conductive film D2 is provided along an outer edge of a through hole 36 when seen in a plan view.

Specifically, the second conductive film D2 is provided on the entire periphery of an end of a third principal surface 35 on the through hole 36 side (provided at the outer edge of the opening of the through hole 36) so as to surround the through hole 36. The second conductive film D2 is connected to a first conductive film D1 and a wiring pattern P3.

Meanwhile, the second conductive film D2 may or may not be wrapped around an inner wall 36*a* of the through hole 36.

In the quartz crystal resonator 4, when the second conductive film D2 is wrapped around the inner wall 36*a* of the through hole 36, thermal conductivity with respect to the thermistor 20 is improved. The formation of the second conductive film D2 is facilitated to such an extent that there is no wraparound when the second conductive film is not wrapped around the inner wall 36*a*.

As described above, in the quartz crystal resonator 4 according to the second embodiment, the second conductive film D2 is provided along the outer edge of the through hole 36 when seen in a plan view.

Thereby, in the quartz crystal resonator 4, the through hole 36 can be recognized by an image recognition apparatus using a difference in the contrast of reflected light between the second conductive film D2 and the vicinity, for example, when irradiation with light is performed, and thus it is possible to improve the mounting position accuracy of the thermistor 20 with respect to the through hole 36.

According to this configuration, the quartz crystal resonator 4 can also solve a problem in that it is difficult to recognize the through hole 36 using the image recognition apparatus, in the configuration of the related art (for example, the above-described configuration of JP-A-2013-102315) in which a difference in contrast between the through hole 36 and the vicinity is small.

Meanwhile, when this problem is merely solved, the second conductive film D2 is not necessarily connected to the first conductive film D1 and the wiring pattern P3.

Meanwhile, the second conductive film D2 may be partially disconnected in a range in which image recognition is not affected (for example, a diagonal portion remains).

Meanwhile, the configuration of the quartz crystal resonator 4 can also be applied to the above-described modified examples and the following embodiments.

Third Embodiment

Next, a quartz crystal resonator according to a third embodiment will be described.

Figure 5A:
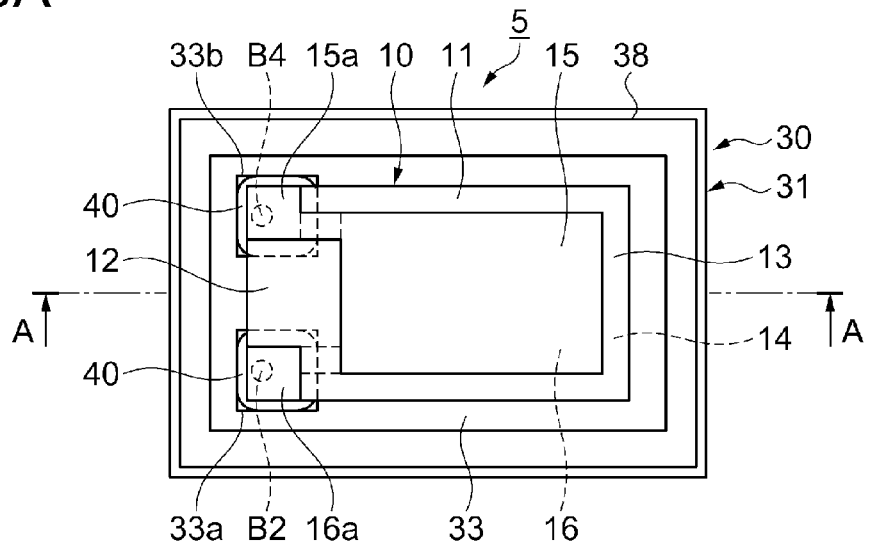
FIGS. 5A to 5C are diagrams showing a schematic configuration of a quartz crystal resonator according to a third embodiment.
Figure 5B:
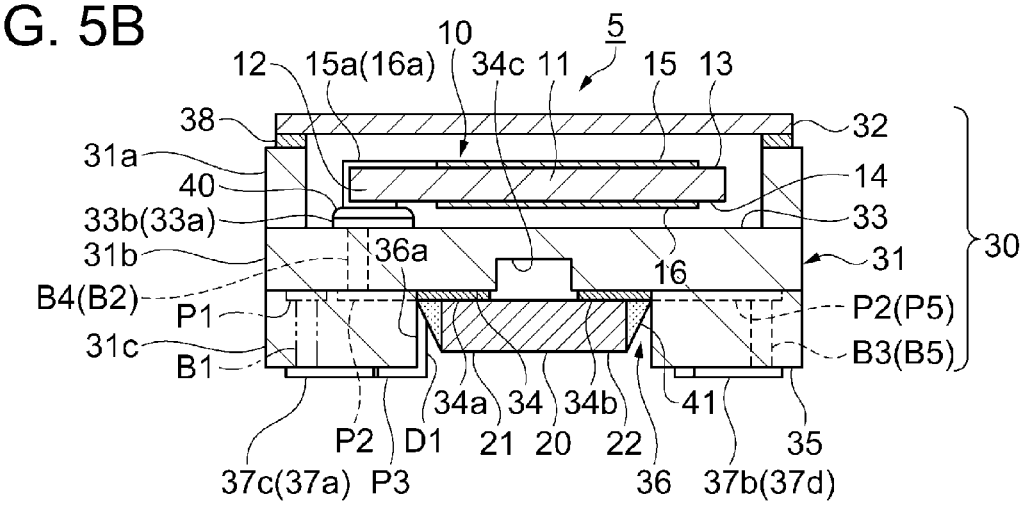
Figure 5C:
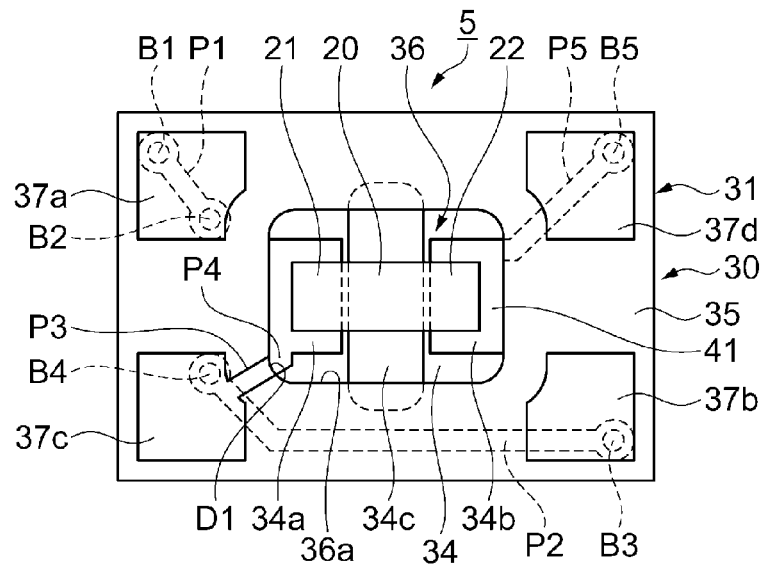

FIGS. 5A to 5C are diagrams showing a schematic configuration of the quartz crystal resonator according to the third embodiment. FIG. 5A is a plan view when viewed from a lid side, FIG. 5B is a cross-sectional view taken along line A-A of FIG. 5A, and FIG. 5C is a plan view when viewed from a bottom side. Meanwhile, in FIG. 5A, the lid is not shown.

Meanwhile, portions in common with those in the first embodiment are denoted by the same reference numerals and signs, and the detailed description thereof will be omitted. The description will be given focusing on the differences from the first embodiment.

As shown in FIGS. 5B and 5C, in a quartz crystal resonator 5 according to the third embodiment, a groove portion 34c is provided between an electrode pad 34a and an electrode pad 34b of a package base 31 on the second principal surface 34 side.

A planar shape of the groove portion 34c is substantially a rectangular shape, and a cross-sectional shape thereof is substantially a concave shape. The groove portion extends so as to be longer than the length of each of facing sides (herein, a long side extending in a vertical direction of the paper in FIG. 5C) of the electrode pad 34a and the electrode pad 34b.

Accordingly, in the quartz crystal resonator 5 according to the third embodiment, the groove portion 34c is provided between the electrode pad 34a and the electrode pad 34b of the package base 31 on the second principal surface 34 side, and thus the outflow of a bonding member 41 such as solder at the time of mounting a thermistor 20 is blocked by the groove portion 34c.

Specifically, the bonding member 41 is divided into the member accumulated on the electrode pads 34a and 34b and the member flowing into the bottom of the groove portion 34c due to wettability, and hardly straddles the groove portion 34c.

As a result, in the quartz crystal resonator 5, it is possible to suppress a short circuit occurring between the electrode pad 34a and the electrode pad 34b through the bonding member 41.

According to this configuration, the quartz crystal resonator 5 can also solve a problem of a short circuit between the electrode pad 34a and the electrode pad 34b through the bonding member 41, in the configuration of the related art (for example, the above-described configuration of JP-A-2013-102315).

Meanwhile, the groove portion 34c can be formed by pressing a groove forming apparatus until the tip of a convex portion of the groove forming apparatus reaches a predetermined depth of the groove portion 34c from the second principal surface 34, for example, before the package base 31 is baked. The groove forming apparatus has the convex portion in the second principal surface 34 of a second layer 31b, the convex portion having a planar shape which is substantially the same as that of the groove portion 34c and having a protrusion height which is equal to or larger than the predetermined depth of the groove portion 34c.

Meanwhile, in FIG. 5C, the groove portion 34c is formed larger than the through hole 36 in the vertical direction of the paper. Thus, in the quartz crystal resonator 5, it is possible to increase the allowable amount of the bonding member 41 flowing into the bottom of the groove portion 34c.

Meanwhile, the groove portion 34c may be formed to have the same size as the through hole 36 in the vertical direction of the paper. On the contrary, the inner wall 36a of the through hole 36 may be notched in the vertical direction of the paper in accordance with the groove portion 34c.

Meanwhile, the configuration of the quartz crystal resonator 5 can also be applied to the above-described modified examples, the above-described embodiments, and the following embodiments.

Fourth Embodiment

Next, a quartz crystal resonator according to a fourth embodiment will be described.

Figure 6A:
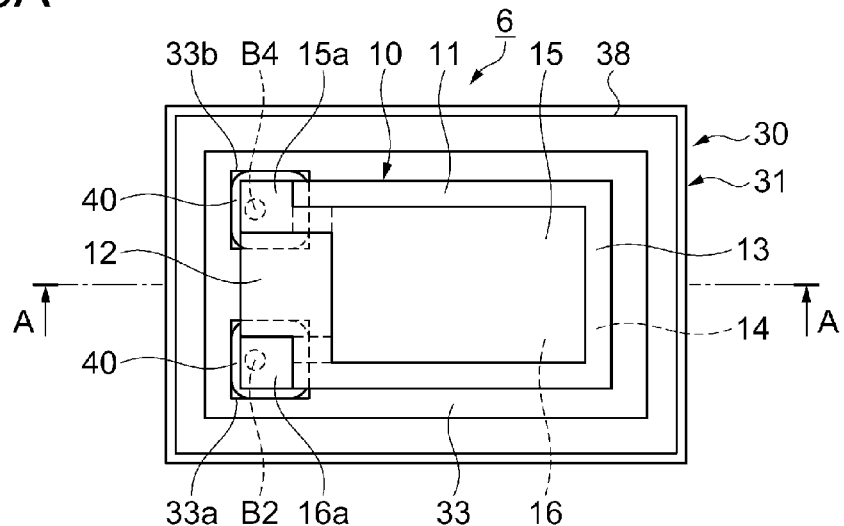
FIGS. 6A to 6C are diagrams showing a schematic configuration of a quartz crystal resonator according to a fourth embodiment.
Figure 6B:
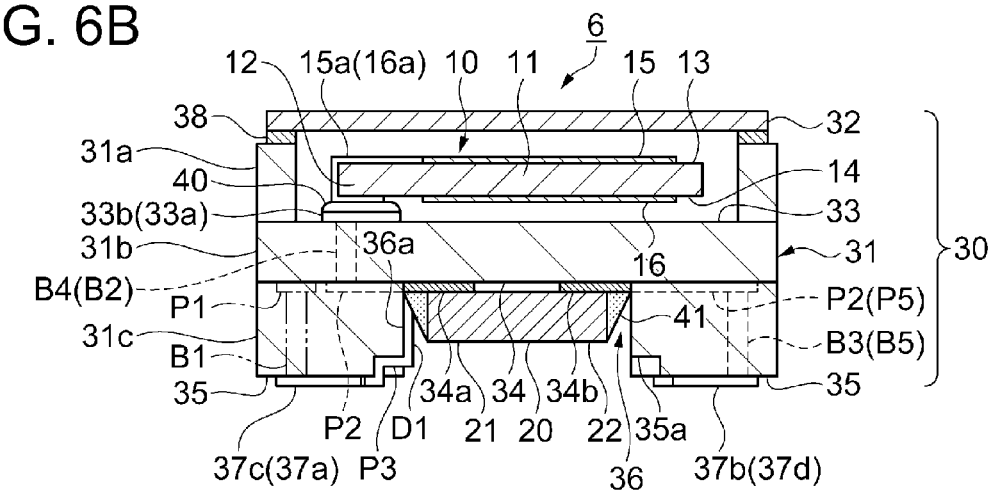
Figure 6C:
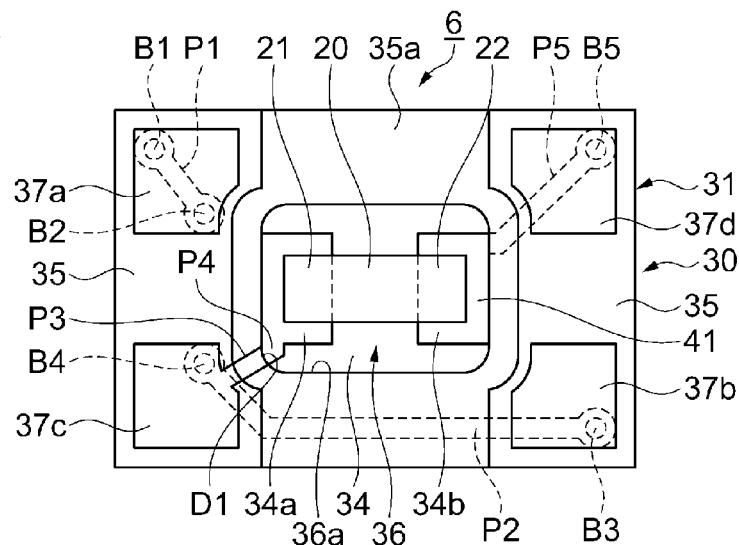

FIGS. 6A to 6C are diagrams showing a schematic configuration of a quartz crystal resonator according to a fourth embodiment; FIG. 6A is a plan view when viewed from a lid side, FIG. 6B is a cross-sectional view taken along line A-A of FIG. 6A, and FIG. 6C is a plan view when viewed from a bottom side. Meanwhile, in FIG. 6A, the lid is not shown.

Meanwhile, portions in common with those in the first embodiment are denoted by the same reference numerals and signs, and the detailed description thereof will be omitted. The description will be given focusing on the differences from the first embodiment.

As shown in FIGS. 6B and 6C, in a quartz crystal resonator 6 according to the fourth embodiment, a stepped portion 35a recessed to a second principal surface 34 side is provided in a third principal surface 35 so as to divide the third principal surface 35 in the horizontal direction of the paper. In the quartz crystal resonator 6, a through hole 36 is provided in the stepped portion 35a.

Meanwhile, mounting terminals 37a and 37c are provided at a portion of the divided third principal surface 35 on the left side of the paper, and mounting terminals 37b and 37d are provided at a portion of the divided third principal surface 35 on the right side of the paper.

Accordingly, in the quartz crystal resonator 6 according to the fourth embodiment, the stepped portion 35a recessed to the second principal surface 34 side is provided in the third principal surface 35 of the package base 31, and the through hole 36 is provided in the stepped portion 35a, and thus it is possible to enlarge an interval in a thickness direction between a first conductive film D1 of the through hole 36 and the mounting terminals 37a to 37d.

As a result, in the quartz crystal resonator 6, it is possible to suppress a short circuit occurring between the first conductive film D1 and the mounting terminals 37a, 37b, and 37d which are not connected to each other, due to a bonding member such as solder when the quartz crystal resonator is mounted on an external member such as an electronic device.

In the quartz crystal resonator 6, air permeability around the through hole 36 is improved by the stepped portion 35a when the quartz crystal resonator is mounted on an external member such as an electronic device, and thus the through hole 36 is not likely to be filled with heat. Thereby, in the quartz crystal resonator 6, it is possible to improve the temperature detection accuracy of the thermistor 20.

Meanwhile, the stepped portion 35a may be formed to have a shape that does not divide the third principal surface 35 (shape in which the third principal surface 35 is formed to be continuous in a frame shape when seen in a plan view).

Meanwhile, the configuration of the quartz crystal resonator 6 can also be applied to the above-described modified examples and the above-described embodiments. In particular, when the configuration of the quartz crystal resonator is applied to the quartz crystal resonator 4 according to the second embodiment, it is possible to suppress a short circuit between the first and second conductive films D1 and D2 and the mounting terminals 37a, 37b, and 37d which are not connected to each other, due to a bonding member such as solder when the quartz crystal resonator is mounted on an external member such as an electronic device.

Oscillator

Next, a quartz crystal oscillator will be described as an example of an oscillator including the above-described resonation device.

Figure 7:
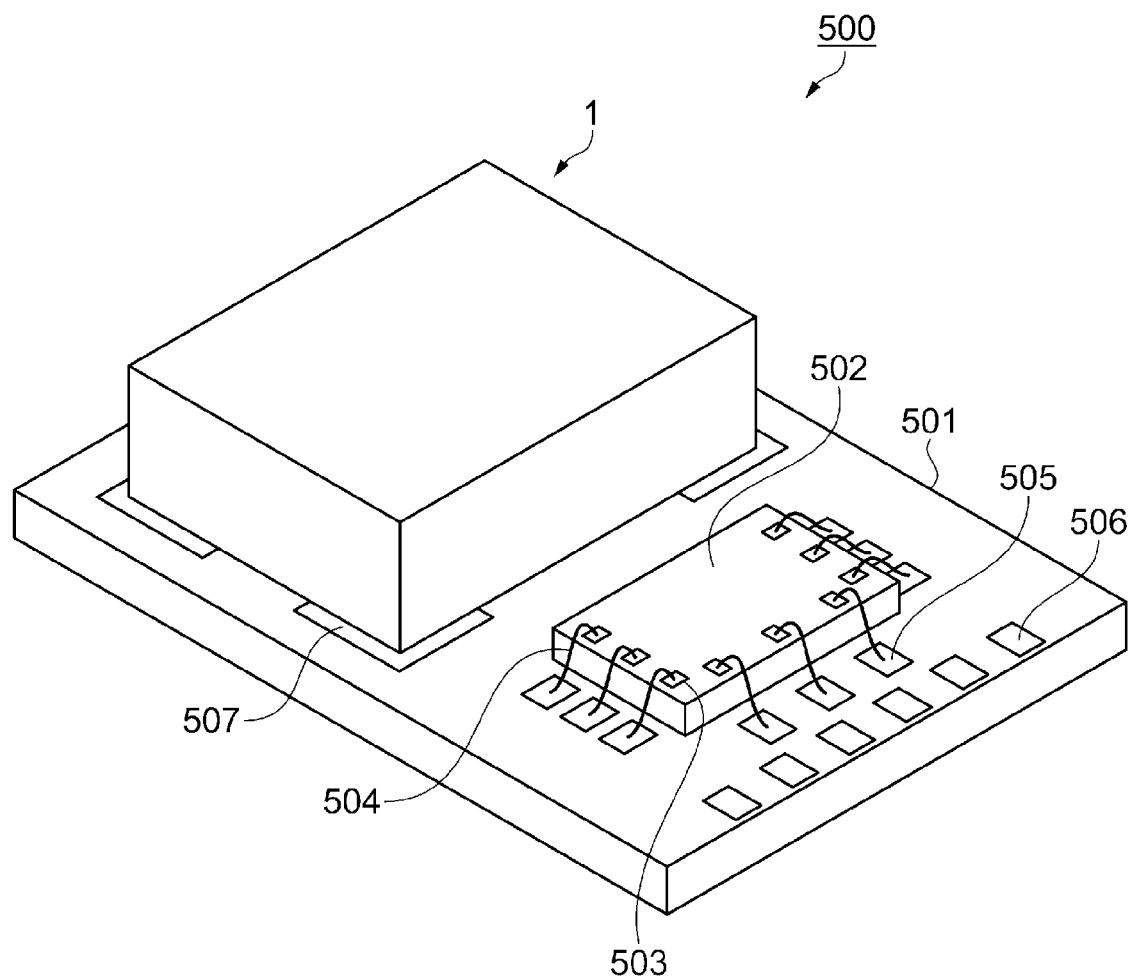
FIG. 7 is a schematic perspective view showing a quartz crystal oscillator as an oscillator.

FIG. 7 is a schematic perspective view showing a quartz crystal oscillator as an oscillator.

As shown in FIG. 7, a quartz crystal oscillator 500 includes any one (herein, for example, the quartz crystal resonator 1) of the quartz crystal resonators as the resonation devices described in the above-described embodiments and modified examples, and an IC chip 502, as a circuit, which is a driving circuit (oscillation circuit) driving (oscillating) the quartz crystal resonator element 10 of the quartz crystal resonator 1.

The quartz crystal oscillator 500 is a module type quartz crystal oscillator in which the quartz crystal resonator 1 and the IC chip 502 are mounted on a base substrate 501 having substantially a rectangular flat plate shape. An oscillation circuit oscillating the quartz crystal resonator element 10 of the quartz crystal resonator 1 is built in the IC chip. Meanwhile, a molding resin covering the IC chip 502 is omitted.

A plurality of pads 503 of the IC chip 502 are connected to a plurality of internal terminals 505, respectively, which are provided in the base substrate 501 by using metal wires 504.

The plurality of internal terminals 505 are connected to a plurality of input and output terminals 506 provided in the base substrate 501 and a plurality of electrode pads 507 on which the quartz crystal resonator 1 is mounted, through a wiring pattern not shown in the drawing.

In the quartz crystal oscillator 500, the quartz crystal resonator element 10 of the quartz crystal resonator 1 excites thickness shear resonation and resonates (oscillates) at a predetermined frequency in response to a driving signal from the IC chip 502 started by an external input from the input and output terminals 506, and an oscillation signal obtained from the resonance is amplified by the IC chip 502 and is then output from the input and output terminals 506.

As described above, the quartz crystal oscillator 500 includes any one of the above-described quartz crystal resonators, and thus it is possible to provide the quartz crystal oscillator exhibiting the effects described in the above-described embodiment and modified examples.

In the quartz crystal oscillator 500, the IC chip 502 and the quartz crystal resonator 1 are formed as separate bodies, and thus it is possible to further reduce adverse effects on the quartz crystal resonator 1 due to, for example, heat generation or noise of the IC chip 502 than a case where both the IC chip and the quartz crystal resonator are formed as one body (for example, a case where the IC chip 502 is built in the quartz crystal resonator 1).

Meanwhile, in the quartz crystal oscillator 500, it is preferable that the IC chip 502 includes a temperature compensation circuit that compensates for a frequency fluctuation associated with changes in the temperature of the quartz crystal resonator element 10, in addition to the oscillation circuit.

Accordingly, in the quartz crystal oscillator 500, the IC chip 502 includes both the oscillation circuit that drives the quartz crystal resonator element 10 and the temperature compensation circuit that compensates for a frequency fluctuation associated with changes in the temperature of the quartz crystal resonator element 10 which are detected by the thermistor 20, and thus it is possible to perform temperature compensation of a resonance frequency oscillated by the oscillation circuit and to provide the quartz crystal oscillator having an excellent temperature characteristic.

Meanwhile, in the quartz crystal oscillator 500, the IC chip 502 may be built in the quartz crystal resonator 1. Accordingly, it is possible to achieve the miniaturization of the quartz crystal oscillator 500, as compared with the above-described module type quartz crystal oscillator.

Electronic Device

Next, a mobile phone will be described as an example of an electronic device including the above-described resonation device.

Figure 8:
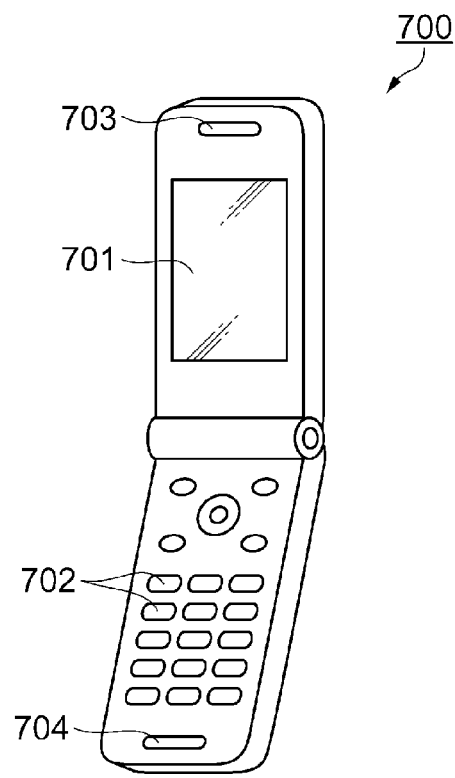
FIG. 8 is a schematic perspective view showing a mobile phone as an electronic device.

FIG. 8 is a schematic perspective view showing a mobile phone as an electronic device.

A mobile phone 700 includes a quartz crystal resonator as the resonation device described in the above-described embodiment and modified examples.

In the mobile phone 700 shown in FIG. 8, any one of the above-described quartz crystal resonators is used as a timing device such as a reference clock oscillation source. Further, the mobile phone is configured to include a liquid crystal display 701, a plurality of operation buttons 702, an earpiece 703, and a mouthpiece 704. Meanwhile, the form of the mobile phone is not limited to the type described in the drawing, and may be a so-called smartphone type.

The resonation device such as the above-described quartz crystal resonator is not limited to the mobile phone, and can be suitably used as a timing device of an electronic device including an electronic book, a personal computer, a television, a digital still camera, a video camera, a video recorder, a navigation apparatus, a pager, an electronic organizer, an electronic calculator, a word processor, a workstation, a video phone, a POS terminal, a game machine, medical equipment (for example, an electronic thermometer, a sphygmomanometer, a blood glucose meter, an electrocardiographic measurement device, an ultrasonic diagnostic apparatus, and an electronic endoscope), a fish detector, various measurement apparatuses, instruments, a flight simulator, and the like. In any case, it is possible to provide an electronic device exhibiting the effects described in the above-described embodiments and modified examples.

Moving Object

Next, a vehicle will be described as an example of a moving object including the above-described resonation device.

Figure 9:
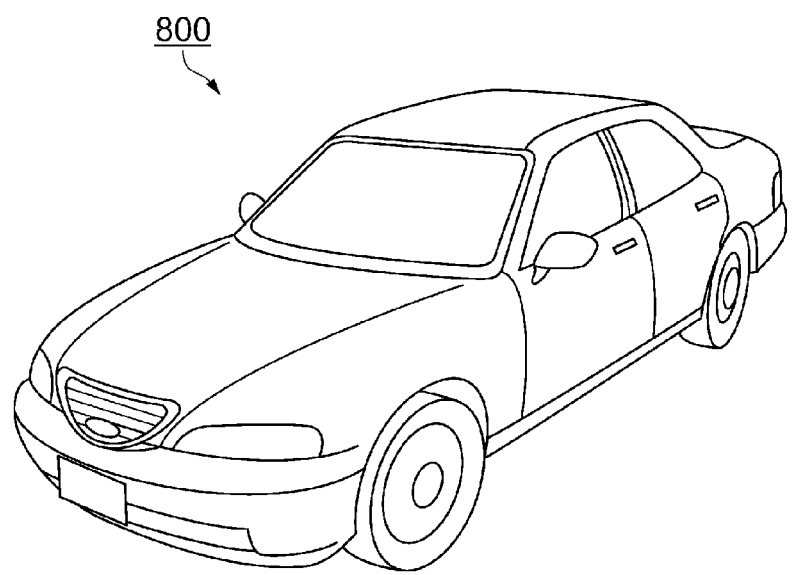
FIG. 9 is a schematic perspective view showing a vehicle as a moving object.

FIG. 9 is a schematic perspective view showing a vehicle as a moving object.

A vehicle 800 includes a quartz crystal resonator as the resonation device described in the above-described embodiments and modified examples.

In the vehicle 800, any one of the above-described quartz crystal resonators is used as a timing device such as a reference clock oscillation source of various electronically controlled devices (for example, an electronically controlled fuel injection device, an electronically controlled ABS device, and an electronically controlled constant speed travel device) mounted thereon.

Accordingly, the vehicle 800 includes the quartz crystal resonator, and thus it is possible to exhibit the effects described in the above-described embodiments and modified examples and to exert an excellent performance.

The resonation device such as the above-described quartz crystal resonator is not limited to the vehicle 800, and can be suitably used as a timing device of a reference clock oscillation source or the like of a moving object including a self-propelled robot, a self-propelled transport device, a train, a ship, an airplane, a satellite, and the like. In any case, it is possible to provide a moving object exhibiting the effects described in the above-described embodiments and modified examples.

Meanwhile, an electronic element mounted on the resonation device is not limited to a thermistor as a thermosensitive element, and may be a chip type element such as a chip resistor, a chip capacitor, or a chip inductor.

In addition, the shape of a resonator element of the resonation device is not limited to a type having a flat plate shape shown in the drawing, and may be a type in which the central portion thereof is thick and the peripheral portion thereof is thin (for example, a convex type, a bevel type, and a mesa type). On the contrary, the shape may be a type in which the central portion thereof is thin and the peripheral portion thereof is thick (for example, an inverted mesa type), or may be a tuning fork type.

Meanwhile, the material of the resonator element is not limited to quartz crystal, and may be a piezoelectric body such as lithium tantalate (LiTaO3), lithium tetraborate (Li2B4O7), lead zirconate titanate (PZT), lithium niobate (LiNbO3), zinc oxide (ZnO), aluminum nitride (AlN) or may be a semiconductor such as silicon (Si).

In addition, a driving method of thickness shear resonation may be not only a method using a piezoelectric effect of a piezoelectric body, but also electrostatic driving using a Coulomb's force.

The entire disclosure of Japanese Patent Application No. 2013-225049, filed Oct. 30, 2013 is expressly incorporated by reference herein.

What is claimed is:

1. A package comprising:
a first substrate that includes a first principal surface and a second principal surface which serve as front and back sides, respectively; and
a second substrate that is laminated on the second principal surface side of the first substrate and has a through hole,
wherein a first electrode pad and a second electrode pad are provided on the first principal surface side of the first substrate,
wherein a third electrode pad and a fourth electrode pad are provided on the second principal surface side of the first substrate, and the third electrode pad and the fourth electrode pad are in the through hole in a plan view,
wherein a first mounting terminal and a second mounting terminal are provided on a first diagonal line on a third principal surface side of the second substrate which is opposite to the first substrate side, and a third mounting terminal and a fourth mounting terminal are provided on a second diagonal line intersecting the first diagonal line,
wherein the first electrode pad is connected to the first mounting terminal through a first wiring pattern provided on the second principal surface side of the first substrate,
wherein the second electrode pad is connected to the second mounting terminal through a second wiring pattern provided on the second principal surface side of the first substrate, and
wherein at least one of the third electrode pad and the fourth electrode pad is connected to any one of the third mounting terminal and the fourth mounting terminal through a first conductive film provided on an inner wall of the through hole.

2. A resonation device comprising:
a resonator element;
an electronic element;
a first substrate that includes a first principal surface and a second principal surface which serve as front and back sides, respectively; and
a second substrate that is laminated on the second principal surface side of the first substrate and has a through hole,
wherein a first electrode pad and a second electrode pad are provided on the first principal surface side of the first substrate,
wherein a third electrode pad and a fourth electrode pad are provided in a portion exposed from the through hole on the second principal surface side of the first substrate,
wherein the resonator element is attached to the first electrode pad and the second electrode pad,
wherein the electronic element is attached to the third electrode pad and the fourth electrode pad,
wherein a first mounting terminal and a second mounting terminal are provided on a first diagonal line on a third principal surface side of the second substrate which is opposite to the first substrate side, and a third mounting terminal and a fourth mounting terminal are provided on a second diagonal line intersecting the first diagonal line,
wherein the first electrode pad is connected to the first mounting terminal through a first wiring pattern provided on the second principal surface side of the first substrate,
wherein the second electrode pad is connected to the second mounting terminal through a second wiring pattern provided on the second principal surface side of the first substrate, and
wherein at least one of the third electrode pad and the fourth electrode pad is connected to any one of the third mounting terminal and the fourth mounting terminal through a first conductive film provided on an inner wall of the through hole.

3. The resonation device according to claim 2, wherein a second conductive film is provided on the third principal surface side of the second substrate along an outer edge of the through hole.

4. The resonation device according to claim 3, wherein the second conductive film is connected to the first conductive film.

5. The resonation device according to claim 2, wherein a groove portion is provided between the third electrode pad and the fourth electrode pad.

6. The resonation device according to claim 3, wherein a groove portion is provided between the third electrode pad and the fourth electrode pad.

7. The resonation device according to claim 4, wherein a groove portion is provided between the third electrode pad and the fourth electrode pad.

8. The resonation device according to claim 2, wherein a stepped portion recessed to the second principal surface side is provided in the third principal surface of the second substrate, and the through hole is provided in the stepped portion.

9. The resonation device according to claim 3, wherein a stepped portion recessed to the second principal surface side is provided in the third principal surface of the second substrate, and the through hole is provided in the stepped portion.

10. The resonation device according to claim 4, wherein a stepped portion recessed to the second principal surface side is provided in the third principal surface of the second substrate, and the through hole is provided in the stepped portion.

11. The resonation device according to claim 2, wherein each of areas of the third electrode pad and the fourth electrode pad accounts for equal to or higher than 15% and equal to or less than 30%, when seen in a plan view, with respect to an area of an opening of the through hole.

12. The resonation device according to claim 11, wherein each of areas of the third electrode pad and the fourth electrode pad accounts for equal to or higher than 19.5% and equal to or less than 23.5%, when seen in a plan view, with respect to the area of the opening of the through hole.

13. The resonation device according to claim 2, wherein each of areas of the third electrode pad and the fourth electrode pad accounts for equal to or higher than 70% and equal to or less than 150%, when seen in a plan view, with respect to an area of the electronic element.

14. The resonation device according to claim 13, wherein each of areas of the third electrode pad and the fourth electrode pad accounts for equal to or higher than 75% and equal to or less than 145%, when seen in a plan view, with respect to an area of the electronic element.

15. The resonation device according to claim 2, wherein an outline of the through hole includes a curved line when seen in a plan view.

16. The resonation device according to claim 2, wherein an outline of each of the mounting terminals on the through hole side includes a curved line when seen in a plan view.

17. The resonation device according to claim 2, wherein the electronic element is a thermosensitive element.

18. An oscillator comprising:
   the resonation device according to claim 2; and
   a circuit.

19. An electronic device comprising the resonation device according to claim 2.

20. A moving object comprising the resonation device according to claim 2.

* * * * *